(12) United States Patent
Miyoshi et al.

(10) Patent No.: US 7,135,347 B2
(45) Date of Patent: Nov. 14, 2006

(54) METHOD FOR MANUFACTURING NITRIDE FILM INCLUDING HIGH-RESISTIVITY GAN LAYER AND EPITAXIAL SUBSTRATE MANUFACTURED BY THE METHOD

(75) Inventors: Makoto Miyoshi, Inazawa (JP); Masahiro Sakai, Nagoya (JP); Mitsuhiro Tanaka, Handa (JP); Takashi Egawa, Nagoya (JP); Hiroyasu Ishikawa, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 217 days.

(21) Appl. No.: 10/873,767

(22) Filed: Jun. 22, 2004

(65) Prior Publication Data

US 2005/0009221 A1    Jan. 13, 2005

(30) Foreign Application Priority Data

Jun. 23, 2003   (JP) ............................. 2003-178724
Nov. 14, 2003   (JP) ............................. 2003-385131

(51) Int. Cl.
    *H01L 21/00*    (2006.01)
(52) U.S. Cl. ..................... 438/46; 438/93; 438/590
(58) Field of Classification Search ............... 438/285, 438/507, 590, 783, 46, 22, 93, 779
See application file for complete search history.

(56) References Cited

U.S. PATENT DOCUMENTS 3,852,796 A * 12/1974 Cuomo et al. .............. 257/200

6,870,203 B1 * 3/2005 Taniguchi et al. .......... 257/194
2002/0079508 A1 * 6/2002 Yoshida ..................... 257/192

OTHER PUBLICATIONS

M. Asif, Khan, et al., "High Electron Mobility Transistor Based on a $GaN-Al_xGa_{1-x}N$ Heterojunction," Applied Physics Letters, vol. 63, No. 9, Aug. 30, 1993, pp. 1214-1215.
S. Keller et al., "Metalorganic Chemical Vapor Deposition of High Mobility AlGaN/GaN Heterostructures," Journal of Applied Physics, vol. 86, No. 10, Nov. 15, 1999, pp. 5850-5857.
T. Egawa et al, "Recessed Gate AlGaN/GaN Modulation-Doped Field-Effect Transistors on Sapphire," Applied Physics Letters vol. 76, No. 1, Jan. 3, 2000, pp. 121-123.
S. Arulkumaran et al, "Improved dc Characteristics of AlGaN/GaN High-Electron-Mobility Transistors on AlN/Sapphire Templates," Applied Physics Letters vol. 81, No. 6, Aug. 5, 2002, pp. 1131-1133.

* cited by examiner

*Primary Examiner*—Kevin M. Picardat
(74) *Attorney, Agent, or Firm*—Burr & Brown

(57) ABSTRACT

A method for manufacturing a nitride film including a high-resistivity GaN layer includes a step of allowing a Group-III source gas containing an organic metal compound, a Group-V source gas containing ammonia, a carrier gas for the Group-III source gas, and a carrier gas for the Group-V source gas to flow over a predetermined monocrystalline wafer maintained at 1,000° C. or more and also includes a step of epitaxially growing a nitride film, including a GaN layer, on the monocrystalline wafer by a vapor phase reaction of the source gases. At least one of the carrier gases contains nitrogen while the wafer temperature is being increased before the reaction is carried out. At least one of the carrier gases contains hydrogen and nitrogen and has a total hydrogen and nitrogen content of 90 percent by volume or more in at least one part of the epitaxially growing step.

12 Claims, 4 Drawing Sheets

METHOD FOR MANUFACTURING NITRIDE FILM INCLUDING HIGH-RESISTIVITY GAN LAYER AND EPITAXIAL SUBSTRATE MANUFACTURED BY THE METHOD

This application claims the benefit of Japanese Application No. 2003-178724, filed Jun. 23, 2003, and Japanese Application No. 2003-385131, filed Nov. 14, 2003, the entireties of which are incorporated herein by reference.

BACKGROUND OF THE INVENTION

1. Field of the Invention

The present invention relates to methods for manufacturing epitaxial layers suitable for substrates included in semiconductor devices such as photonic devices and electronic devices. The present invention particularly relates to a method for manufacturing a nitride film including a high-resistivity GaN layer having a resistivity of $10^4$ Ω·cm or more and also relates to an epitaxial substrate manufactured by the method.

2. Description of the Related Art

Films containing Group-III nitrides such as GaN are used as semiconductor films included in semiconductor devices such as photonic devices and electronic devices. Such films are also used as semiconductor films included in high-speed IC chips; hence, the films have been attracting much attention in recent years. In order to form a layer containing a Group-III nitride, the following method has been developed and is now in practical use: the nitride layer is epitaxially grown on a monocrystalline wafer, made of sapphire or the like, by a vapor reaction process or the like.

Described below is a known technique for epitaxially growing the Group-III nitride layer by a vapor reaction process.

A predetermined monocrystalline wafer is provided on a susceptor placed in a reaction chamber and is then heated to a predetermined temperature with heaters arranged inside and outside the susceptor. A gaseous organic metal compound containing a Group-III element and a gaseous nitrogen compound are fed to the reaction tube together with a carrier gas, and a gaseous compound containing another element is also fed thereto according to needs. The gas mixture is allowed to flow over the wafer, whereby a group of layers containing a single Group-III nitride or a plurality of Group-III nitrides are formed by a chemical vapor reaction process.

In the Group-III nitride layers, a GaN layer can be applied to an electronic device such as a field effect transistor if the GaN layer is combined with, for example, a mixed crystal layer containing a Group-III nitride such as AlGaN so as to form a heterostructure.

Since electronic devices having an AlGaN/GaN high-electron-mobility transistor (HEMT) structure disclosed in Khan et al., Appl. Phys. Lett., 63 (1993), 1214 have been achieved, the development thereof is being conducted all over the world. Those GaN electronic devices have been prepared by epitaxially growing predetermined semiconductor layers on sapphire wafers.

FIG. 1 is a schematic view showing a configuration of a field effect transistor functioning as a semiconductor device including a GaN layer.

The field effect transistor 10 shown in FIG. 1 includes a monocrystalline wafer 1 made of monocrystalline sapphire; a base layer 2, grown at about 500° C., containing GaN; a buffer layer 3, grown at 1,000° C. or more, containing GaN; a spacer layer 4 containing AlGaN; a carrier supply layer 5, containing Si-doped n-AlGaN; and a barrier layer 6 containing AlGaN, those layers being disposed on the monocrystalline wafer 1 in that order.

The surface of the barrier layer 6 are partially exposed. The following electrodes are disposed on the respective exposed portions: a source electrode 7 and a drain electrode 8, made of , for example, Ti/Al, which corresponds to an ohmic contact metal for n-type semiconductor layer and a gate electrode 9, made of, for example, Pt/Au, which corresponds to a Schottky contact metal for n-type semiconductor layer.

Electrons generated from the carrier supply layer 5 are confined at the heterointerface between the buffer layer 3 and the spacer layer 4. Therefore, when a predetermined voltage is applied between the source electrode 7 and the drain electrode 8, the electrons are allowed to flow at the interface, whereby current flows in the field effect transistor 10. In order to impart good conduction properties to the field effect transistor, it is critical to form an ideal heterointerface structure that rarely contains impurities and has crystal defects.

On the other hand, in order to allow current interruption to occur in the field effect transistor 10, a predetermined voltage is applied between the gate electrode 9 and the drain electrode 8 while a predetermined voltage is being applied between the source electrode 7 and the drain electrode 8. That is, a reverse bias is applied to the Schottky junction, thereby a depletion region is formed directly under the gate electrode 9 to interrupt the current.

In a field effect transistor, as is the above transistor, including a GaN layer functioning as a buffer layer, the GaN layer must have sufficiently high resistivity. This is because, in the operation of the field effect transistor, current leakage occurs during current interruption if the GaN layer does not have sufficiently high resistivity. Therefore, the GaN layer preferably has a resistivity of $10^4$ Ω·cm or more, more preferably $10^5$ Ω·cm or more, and further more preferably $10^6$ Ω·cm or more.

However, when the GaN layer is grown by the chemical vapor deposition method described above, residual donors of which the number is about $1 \times 10^{16}$ per cubic centimeter and which have an electrically active level remain in the GaN layer even if the GaN layer is not intentionally doped with impurities. Therefore, it has not been able to prepare a GaN layer having a resistivity of 10 Ω·cm or more.

On the other hand, the following technique has been proposed: a GaN layer is increased in resistivity by doping the GaN layer with, for example, an acceptor impurity such as Mg during the growth of the GaN layer or implanting ions into the GaN layer after the layer is formed. However, for electronic devices, it is not preferable that the GaN layer contain any intentionally added impurity. Furthermore, an ideal heterointerface cannot be achieved because the impurity may migrate to the heterointerface. Therefore, desired conduction properties cannot be obtained in some cases.

SUMMARY OF THE INVENTION

Accordingly, it is an object of the present invention to provide a method for manufacturing a nitride film including a high-resistivity GaN layer having a resistivity of $10^4$ Ω·cm or more, more preferably $10^5$ Ω·cm or more, and further more preferably $10^6$ Ω·cm or more without using any intentionally added impurity. It is another object of the present invention to provide an epitaxial substrate manufactured by the method.

The present invention provides a method for manufacturing a nitride film including a high-resistivity GaN layer. The method includes a step of allowing a Group-III source gas containing an organic metal compound that is a gallium source, a Group-V source gas containing ammonia that is a nitrogen source, a carrier gas for the Group-III source gas, and a carrier gas for the Group-V source gas to flow over a predetermined monocrystalline wafer maintained at 1,000° C. or more and also includes a step of epitaxially growing a nitride film, including a GaN layer, on the monocrystalline wafer by a vapor phase reaction of the source gases. At least one of the carrier gases contains nitrogen while the wafer temperature is being increased before the reaction is carried out. At least one of the carrier gases contains hydrogen and nitrogen and has a total hydrogen and nitrogen content of 90 percent by volume or more in at least one part of the epitaxially growing step.

The inventors have researched techniques for enhancing the resistivity of the GaN layer. As a result, the inventors found that the GaN layer has a large resistivity when at least one of the carrier gases contains nitrogen while the wafer temperature is being increased before the reaction is carried out in the epitaxially growing step and when at least one of the carrier gases contains hydrogen and nitrogen and has a total hydrogen and nitrogen content of 90 percent by volume or more in at least one part of the epitaxially growing step. Furthermore, the inventors found that the resistivity of the GaN layer can be adjusted by controlling the nitrogen content that is defined as the percentage of the nitrogen amount in the total nitrogen and hydrogen amount of at least one of the carrier gases.

In the method described above, the epitaxially growing step includes an initial sub-step of starting to form the GaN layer and a principal sub-step of growing the GaN layer in earnest, the principal sub-step being subsequent to the initial sub-step. In the initial sub-step, at least one of the carrier gases preferably has a total hydrogen and nitrogen content of 90 percent by volume or more. Furthermore, in the principal sub-step, at least one of the carrier gases preferably contains only hydrogen. In the initial sub-step, the GaN layer preferably has a thickness of 50 nm or less.

According to the present invention, the resistivity of a GaN layer can be adjusted without using any intentionally added impurity. The present invention provides a method for manufacturing a nitride film including such a GaN layer having a resistivity of $10^4$ Ω·cm, more preferably $10^5$ Ω·cm, and further more preferably $10^6$ Ω·cm.

DESCRIPTION OF THE PREFERRED EMBODIMENTS

The present invention will now be described in detail with reference to embodiments.

Figure 1:
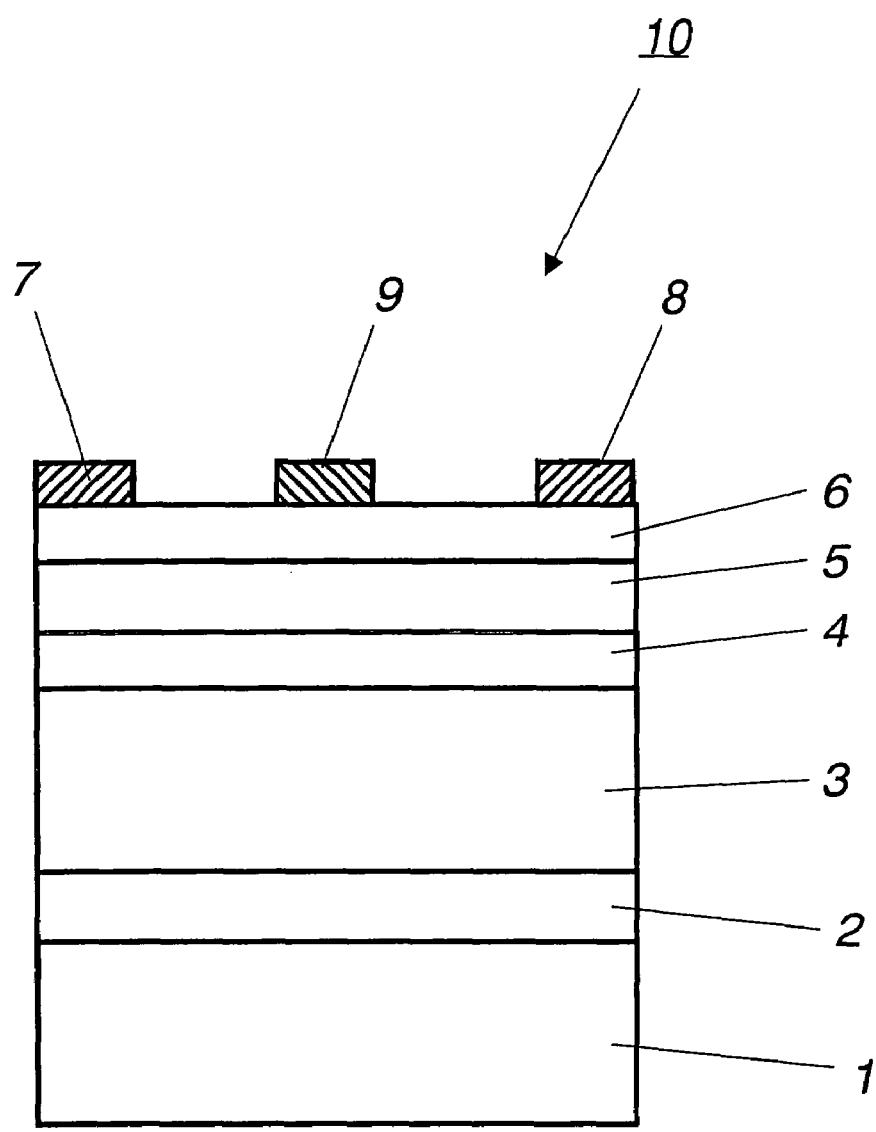
FIG. 1 is a schematic view showing a configuration of a field effect transistor including a GaN layer.
Figure 2:
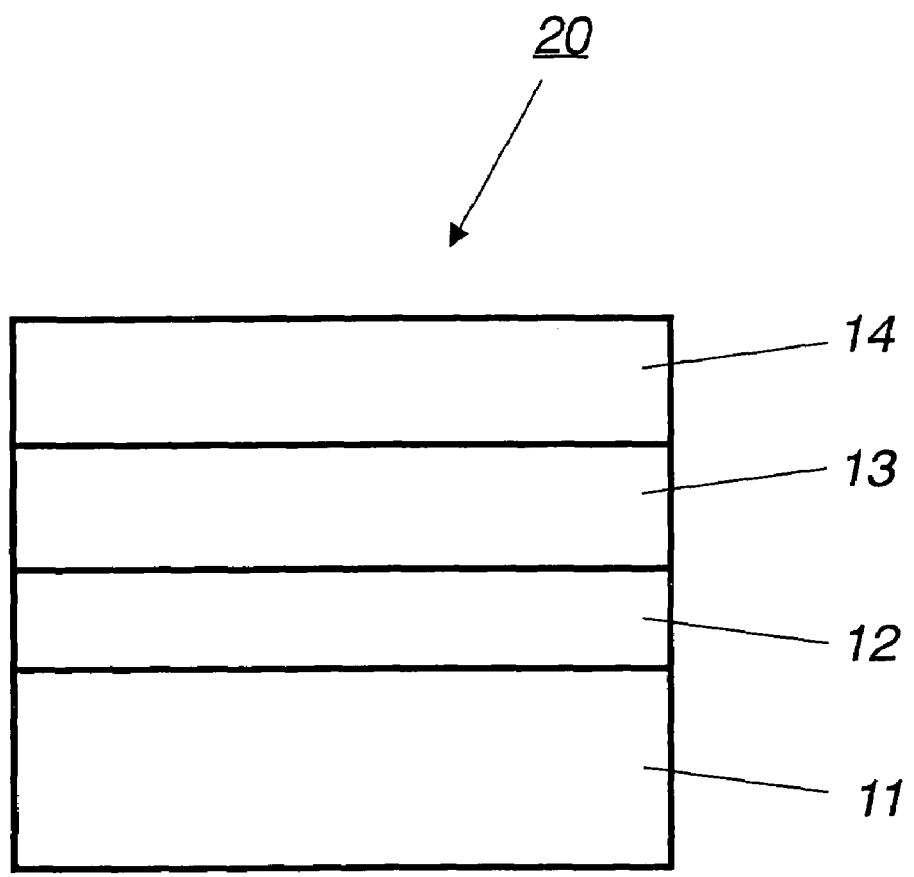
FIG. 2 is a schematic view showing a configuration of an epitaxial substrate according to the present invention.

FIG. 2 is a schematic view showing a configuration of an epitaxial substrate according to the present invention. The epitaxial substrate 20 shown in FIG. 2 includes a monocrystalline wafer 11, a base layer 12 containing a Group-III nitride, and a GaN layer 13 having a resistivity of $10^4$ Ω·cm or more, those layers being disposed on the monocrystalline wafer 11 in that order. The epitaxial substrate 20 may further include Group-III nitride layers 14, disposed on the GaN layer 13, containing, for example, AlGaN.

The term "Group-III nitride layers" is a generic name for a multilayer structure including a plurality of layers containing a single Group-III nitride or a plurality of Group-III nitrides, and such layers form a proper configuration depending on the type of a semiconductor device to be prepared.

Examples of a component for forming the Group-III nitride layers 14 include Group-III elements such as Ga, In, and Al; Si which is used for transforming a Group-III nitride into an n-type conductor; and other elements such as B, Ge, Zn, Be, and Mg. In addition to an intentionally added element, the Group-III nitride layers 14 may further contain a minor element unavoidably captured depending on conditions for forming layers and also contain trace impurities contained in a feedstock and a reactor material.

The base layer 12 is used to compensate the difference in lattice parameter between the monocrystalline wafer 11 and the GaN layer 13 and may have composition represented by the formula $Al_xGa_yN$, wherein $0 \leq x, y \leq 1$, and $x+y=1$. The base layer 12 can be formed at a low temperature ranging from 400° C. to 600° C. by a vapor reaction process and may be referred to as a so-called low-temperature buffer layer. When the base layer 12 is formed at a higher temperature, for example, 1,000° C. or more, the base layer 12 has higher crystallinity.

The crystallinity of the GaN layer 13 and that of the Group-III nitride layers 14, which may disposed on the GaN layer 13, can be enhanced by the presence of the base layer 12 described above.

In addition to Al and Ga, the base layer 12 may contain a Group-III element such as In or an additional element such as B, Si, Ge, Zn, Be, or Mg. In addition to an intentionally added element, the base layer 12 may further contain a minor element unavoidably captured depending on film-forming conditions and also contain trace impurities contained in a feedstock and a reactor material.

The GaN layer 13 is a component of a Group-III nitride film principally containing GaN. The GaN layer 13 may contain an intentionally added element, that is, the GaN layer 13 may contain a minor element unavoidably captured depending on film-forming conditions and also contain trace impurities contained in a feedstock and a reactor material. The GaN layer 13 can be formed by a known film-forming method, such as a vapor reaction process, complying with the requirements described above. The GaN layer 13 can be formed, for example, in the same step as that of forming the base layer 12 or in a step different therefrom.

The Group-III nitride layers 14 can also be formed by a known film-forming method complying with the requirements described above. The Group-III nitride layers 14 can be formed by, for example, a vapor reaction process in the same step as that of forming the GaN layer 13 or in a step different therefrom.

The monocrystalline wafer 11 may contain a known material. Examples of such a material for forming the monocrystalline wafer 11 include oxide single crystals such as a sapphire single crystal, a ZnO single crystal, a $LiAlO_2$ single crystal, a $LiGaO_2$ single crystal, a $MgAl_2O_4$ single crystal, and a MgO single crystal; Group-IV single crystals such as a Si single crystal and a SiC single crystal consisting of the Group-IV elements; single crystals such as a GaAs single crystal, an AlN single crystal, a GaN single crystal, and a AlGaN single crystal that consist of a Group-III element and a Group-V element; and boride single crystals such as a $ZrB_2$ single crystal.

A procedure for preparing the epitaxial substrate 20 shown in FIG. 2 is as follows: the monocrystalline wafer 11 is provided on a susceptor placed in a reactor and is then heated to a predetermined temperature with heaters arranged inside and outside the susceptor; a Group-III source gas containing an organic metal compound containing a Group-III element and a Group-V source gas containing ammonia which is a nitrogen source are introduced into the reactor together with respective carrier gases, and an additional source gas containing another element is also introduced into the reactor together with a carrier gas therefor according to needs; those gases are allowed to flow over the monocrystalline wafer 11, whereby the base layer 12 and the GaN layer 13 are formed by a vapor reaction process and the Group-III nitride layers 14 are also formed depending on the kind of a semiconductor device to be formed.

In order to allow the GaN layer 13 to have a resistivity of $10^4$ Ω·cm or more, the following requirements must be satisfied: in the step of forming the GaN layer 13 by the vapor reaction process, at least one of the carrier gases for the source gases contains nitrogen while the wafer temperature is being increased before the vapor phase reaction is carried out; and, in at least one part of the step of forming the GaN layer 13 by the vapor reaction process, at least one of the carrier gases has a total nitrogen and hydrogen content of 90 percent by volume or more, that is, at least one of the carrier gases principally contains nitrogen and hydrogen, which are main components. In the present invention, the term "main component" means a component of which the content in one of the carrier gases is 90% or more and preferably 95% or more on a volume basis. Furthermore, while the wafer temperature is being increased before the reaction is carried out, at least one of the carrier gases may contain nitrogen and the carrier gases preferably both contain nitrogen. In at least one part of the step of forming the GaN layer 13 by the vapor reaction process, at least one of the carrier gases may have a total nitrogen and hydrogen content of 90 percent by volume or more and the carrier gases preferably both have a total nitrogen and hydrogen content of 90 percent by volume or more.

In the present invention, the step of forming the GaN layer 13 by the vapor phase reaction includes two sub-steps: an initial sub-step of starting to form the GaN layer and a principal sub-step of growing the GaN layer, the principal sub-step subsequent to the initial sub-step. The term "initial sub-step of starting to form the GaN layer" (hereinafter simply referred to as "initial sub-step") is defined as an early stage of forming the GaN layer that takes control of properties of a nitride film finally obtained. If conditions of the initial sub-step are not proper, the obtained nitride film cannot have high crystallinity and/or resistivity in some cases. In the initial sub-step, the GaN layer disposed on the wafer preferably has a thickness of 50 nm or less.

In the initial sub-step, at least one of the carrier gases has a total nitrogen and hydrogen content of 90 percent by volume or more and more preferably 95 percent by volume or more. According to such a condition, the resistivity of the GaN layer 13 can be efficiently enhanced. In the present invention, the carrier gases preferably both comply with the above condition in particular.

In the principal sub-step, at least one of the carrier gases contains only hydrogen. According to such a condition, the GaN layer 13 can be grown so as to have high resistivity and crystallinity. In the present invention, the phrase "a carrier gas contains only hydrogen" means that a carrier gas contains pure hydrogen having a purity of 99.99 percent by volume or more. In the principal sub-step, the carrier gases preferably both contain only hydrogen.

In a method for forming the nitride film including the GaN layer 13 having high resistivity according to the present invention, a system for feeding the source gases used in the vapor reaction process is not particularly limited and the following system is preferable: a system in which the source gases are fed to the monocrystalline wafer 11, horizontally placed, in the horizontal direction in such a manner that the gases are separated into upper and lower streams. The term "a system for feeding gases in such a manner that the gases are separated into an upper stream and a lower stream" means that the Group-III source gas and the Group-III source gas are fed to the monocrystalline wafer 11 in such a manner that the gases are separated into laminar streams.

A way for allowing the gases to flow in a laminar manner are not particularly limited and the following way is preferable: the Group-V source gas and the carrier gas therefor are fed from a lower portion and the Group-III source gas and the carrier gas therefor are fed from an upper portion. According to that way, the GaN layer 13 having high resistivity can be efficiently formed.

The reactor used for the vapor phase reaction is not particularly limited and any reactor in which gases separated into laminar streams can be fed to the monocrystalline wafer 11 in the horizontal direction can be used. For example, the following reactor can be used: a reactor in which gases are fed to a plurality of wafers, placed on a rotary susceptor, in the horizontal direction while the susceptor is being rotated. Furthermore, the following reactor can be used: a reactor in which gases are fed to a plurality of wafers, placed on each of a plurality of rotary susceptors mounted on a rotary stage, in the horizontal direction in such a manner that the susceptors are turned around an axis while the susceptors are being rotated, this type being referred to as a planetary type.

In the planetary-type reactor, a system for feeding the gases to the reactor is not particularly limited any system in which the gases separated into laminar streams are fed to the monocrystalline wafer 11 in the substantially horizontal direction can be used. For example, the following system can be used: a system in which gases are fed to the vicinity of the center of the rotary stage in the vertical direction. This is because the gases are fed to the monocrystalline wafer 11 in the horizontal direction by the diffusion of the gasses.

For the reactor used for the vapor phase reaction, any type of reactor in which gases separated into laminar streams can be fed to the monocrystalline wafer 11 in the horizontal direction can be used as described above. In particular, a horizontal reactor is preferably used, whereby the source gases separated into the laminar streams can be fed readily and efficiently.

Examples of a system for feeding the source gases separated into the laminar streams include a two-line system consisting of a line for feeding the Group-III source gas and a line for feeding the Group-V source gas and also include a three-line system consisting of a line, placed at the top position, for feeding a stabilizing gas containing nitrogen and/or hydrogen and the lines described above.

While the wafer temperature is being increased before the vapor phase reaction is carried out, at least one of the carrier gases must contain nitrogen. The resistivity of the GaN layer 13 can be enhanced by increasing the nitrogen content. Therefore, in particular, it is preferable that only nitrogen be fed through the line for feeding the Group-III source gas and ammonia and nitrogen functioning as a carrier gas be fed through the line for feeding the Group-V source gas in the above operation.

In at least one part of the step of forming the GaN layer 13 by the vapor reaction process, at least one of the carrier gases must principally contain nitrogen and hydrogen as described above. The resistivity of the GaN layer 13 can be adjusted by controlling the percentage (the nitrogen content) of the nitrogen amount in the total nitrogen and hydrogen amount. In particular, the resistivity of the GaN layer 13 can be enhanced by increasing the nitrogen content.

In at least one part of the step of forming the GaN layer 13, the nitrogen content of one of the carrier gases is not particularly limited and is preferably 1 percent by volume or more. The GaN layer 13 has a resistivity of $10^5$ Ω·cm or more when the nitrogen content is 1 percent by volume or more, whereas the GaN layer 13 has a resistivity of less than $10^4$ Ω·cm when the nitrogen content is less than 1 percent by volume.

In at least one part of the step of forming the GaN layer 13, the nitrogen content of at least one of the carrier gases is preferably 1 percent by volume or more and more preferably 3 percent by volume or more. The GaN layer 13 has a resistivity of $10^6$ Ω·cm or more when the nitrogen content is 3 percent by volume or more.

In at least one part of the step of forming the GaN layer 13, the upper limit of the nitrogen content of at least one of the carrier gases is not particularly limited because the resistivity of the GaN layer 13 increases with an increase in the nitrogen content. When the nitrogen content is 70 percent by volume or less, there is an advantage in that the GaN layer 13 is not deteriorated in morphology and therefore has a highly flat surface.

The nitrogen content herein used is defined as the percentage of the nitrogen amount in the total nitrogen and hydrogen amount of one of the carrier gases, the percentage being expressed on a volume basis. Any gas having a nitrogen content that is within the range herein specified can be used. For example, one of the carrier gases may contain argon or helium, which is an inert gas, or a gas mixture containing such a gas in addition to hydrogen and nitrogen. Furthermore, one of the carrier gases may contain a minor element unavoidably captured depending on layer-forming conditions and also contain trace impurities contained in a feedstock and a reactor material in addition to the intentionally added elements.

The kind of the stabilizing gas fed from the three-line system including the line, placed at the top position, for feeding the stabilizing gas is not particularly limited and any gas can be used other than the carrier gases herein specified. For example, an inert gas such as argon or helium or a gas mixture containing such a gas can be used other than hydrogen and nitrogen.

The present invention provides a method for manufacturing the nitride film including the GaN layer 13, which has a resistivity of $10^4$ Ω·cm or more, more preferably $10^5$ Ω·cm or more, and more preferably $10^6$ Ω·cm or more without using any intentionally added impurity. The above method may be combined with a method in which the intentionally added impurity is used. Examples of the intentionally added impurity include Group-III elements such as Al and In and other elements such as B, Si, Ge, Zn, Be, and Mg. In the step of forming the GaN layer 13 by the vapor phase reaction, trimethyl gallium and ammonia may be used. The GaN layer 13 may be allowed to contain a large amount of carbon intentionally by increasing the ratio of the flow rate of trimethyl gallium to that of ammonia.

EXAMPLES

The present invention will now be described in detail with reference to examples.

Figure 3:
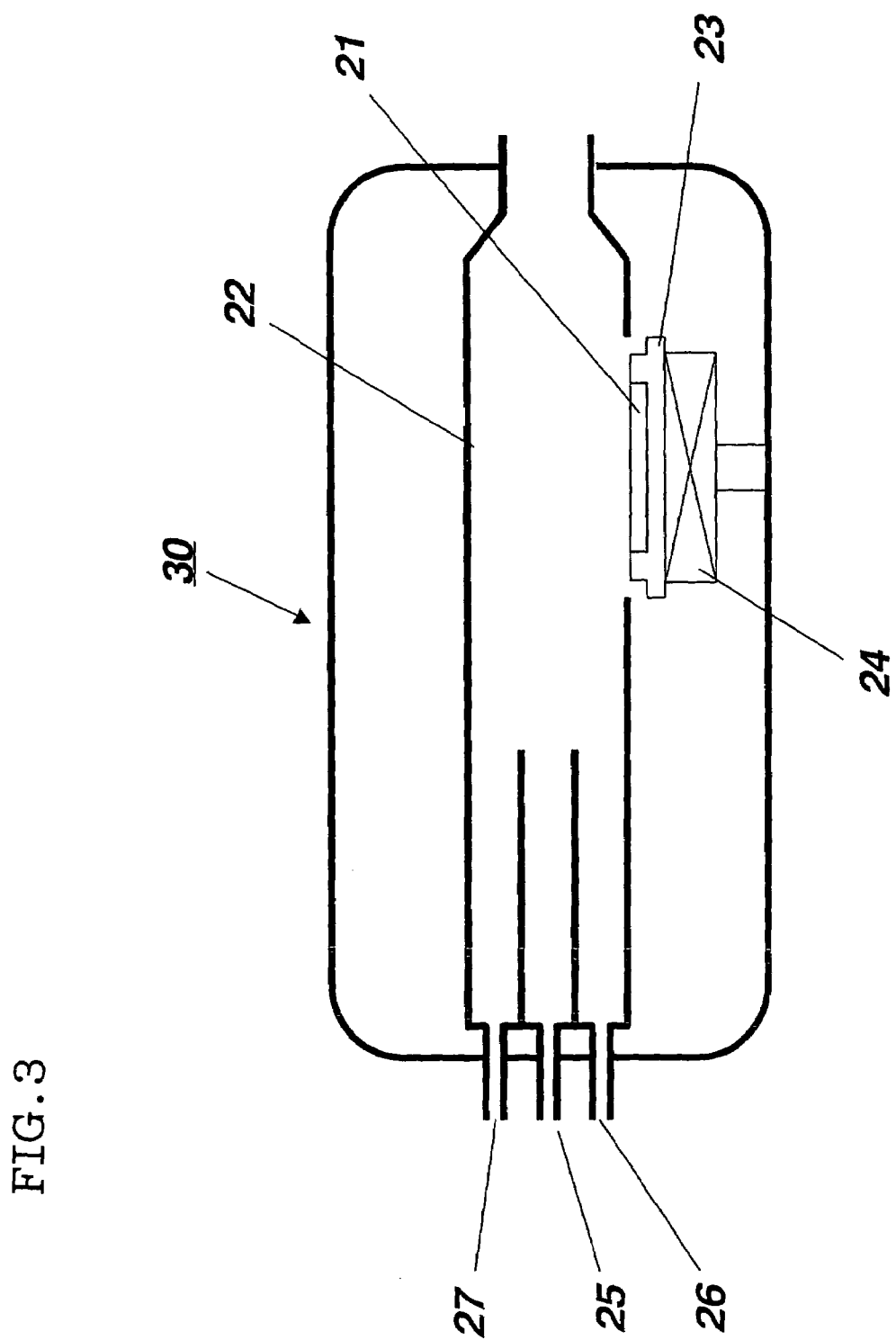
FIG. 3 is a schematic view showing a configuration of a vapor phase epitaxial apparatus used to make the present invention.

FIG. 3 is a schematic view showing a vapor phase epitaxial apparatus used by the inventors. A procedure for forming a GaN layer using the vapor phase epitaxial apparatus 30 shown in FIG. 3 is as described below. A predetermined monocrystalline wafer 21 is provided on a susceptor 23 placed in a reactor 22 and then heated with a resistance heater 24 placed directly under the susceptor 23. An organic metal source gas containing a Group-III element and a carrier gas for the organic metal source gas are fed to the reactor 22 through a Group-III source gas supply line 25; an ammonia gas, which is a nitrogen source, and a carrier gas for the ammonia gas are fed thereto through a Group-V source gas supply line 26; a nitrogen gas functioning as a stabilizing gas is fed thereto through a stabilizing gas supply line 27; and a source gas containing another element is fed thereto through the stabilizing gas supply line 27 according to needs. Those gases are allowed to flow over the monocrystalline wafer 21, whereby a nitride film including a GaN layer is formed by a vapor reaction process.

Example 1

A sapphire wafer having a diameter of two inches and a thickness of 330 μm was pretreated with sulfuric acid and hydrogen peroxide and then placed in the vapor phase epitaxial apparatus 30. The wafer was heated to about 1,200° C. and maintained at the temperature for ten minutes while a hydrogen carrier gas is being allowed to flow at a flow speed of 2 m/sec, whereby the wafer was thermally cleaned. The resulting wafer was cooled to about 500° C. A gas mixture containing gaseous trimethyl gallium (TMG) functioning as a Group-III source gas and hydrogen functioning as a carrier gas for TMG was allowed to flow over the resulting wafer at a flow speed of 2 m/sec and another gas mixture containing ammonia functioning as a Group-V source gas and hydrogen functioning as a carrier gas for ammonia was also allowed to flow over the wafer at a flow speed of 2 m/sec, whereby a GaN buffer layer having a thickness of 30 nm was formed.

After the GaN buffer layer was formed, the resulting wafer was heated to 1,180° C. over a period of three minutes while the supply of TMG was stopped, only nitrogen was being fed through the Group-III source gas supply line 25 at a flow speed of 2 m/sec, and a gas mixture containing ammonia and nitrogen functioning as a carrier gas therefor was being fed through the Group-V source gas supply line 26 at a flow speed of 2 m/sec.

A gas mixture containing TMG and a carrier gas therefor was allowed to flow over the resulting wafer at a flow speed of 4 m/sec and the gas mixture containing ammonia and a carrier gas therefor was also allowed to flow over the wafer at a flow speed of 4 m/sec in such a manner that the wafer temperature was maintained at 1,180° C., whereby a GaN layer having a thickness of 3 μm was formed on the GaN buffer layer.

Figure 4:
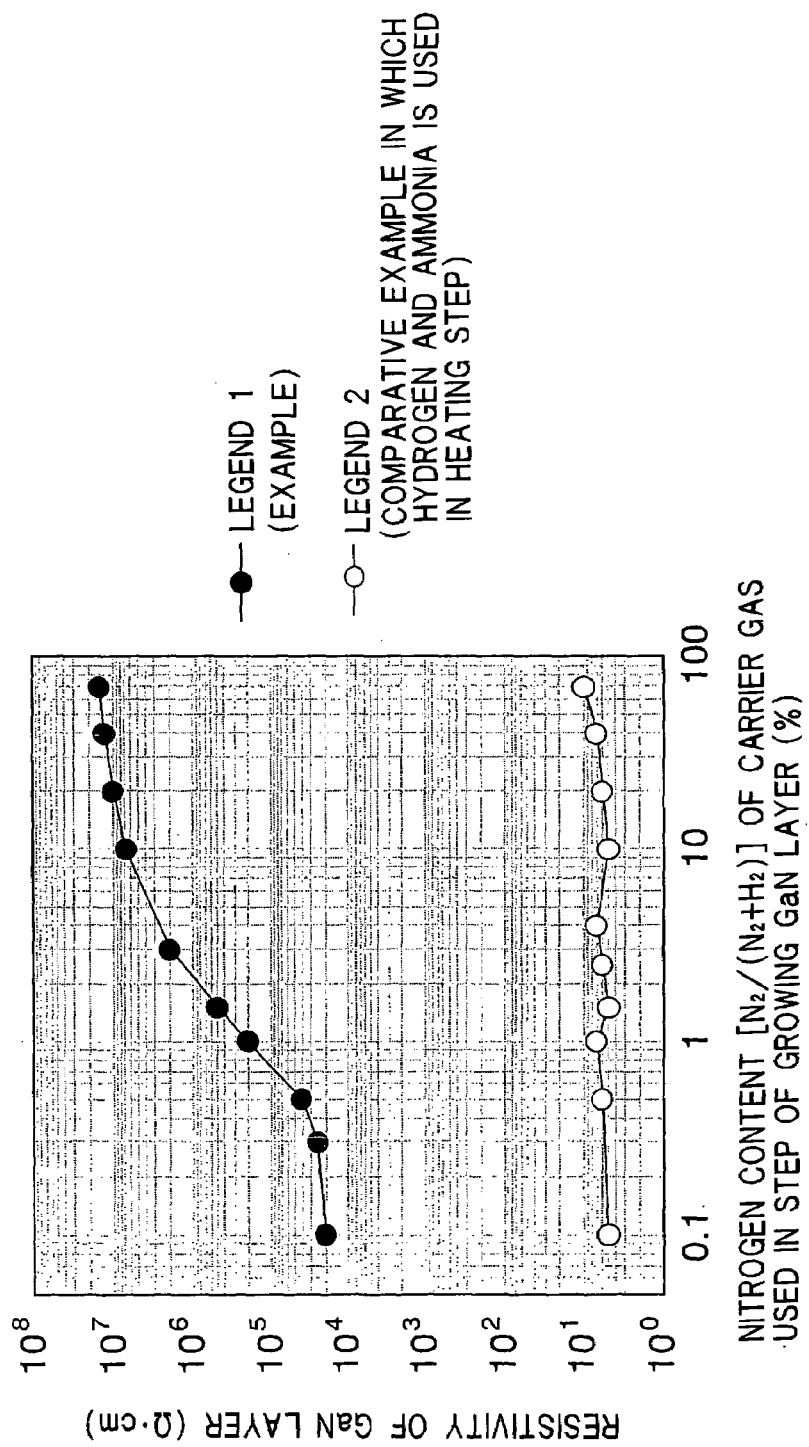
FIG. 4 is a graph showing results of Example 1 and Comparative Example 1.

In the step of forming the GaN layer at 1,180° C., the carrier gas for TMG and the carrier gas for ammonia contained both hydrogen and nitrogen. The above procedure was repeated in such a manner that the nitrogen content was varied from 0.1%, which is the lower limit for a controller, to 70 percent by volume, whereby a plurality of epitaxial substrates each including corresponding GaN layers were prepared. The obtained epitaxial substrates were used as samples for evaluation. All the samples had highly flat mirror surfaces, that is, they had superior surface morphology. The samples were measured for resistivity. Measurement results are shown in FIG. 4 using legend 1. As is clear from FIG. 4, in all the samples, the GaN layers have a resistivity of $10^4$ Ω·cm or more. Furthermore, the GaN layers have a resistivity of $10^5$ Ω·cm or more when the nitrogen content is 1 percent by volume or more, and the GaN layers have a resistivity of $10^6$ Ω·cm or more when the nitrogen content is 3 percent by volume or more.

Example 2

In the step of forming the GaN layer at 1,180° C., a sub-step of increasing the thickness of the GaN layer up to 50 nm was defined as an initial sub-step. A nitride film was prepared by an epitaxial growth process according to the same procedure as that described in Example 1 except that the carrier gas for TMG and the carrier gas for ammonia contained hydrogen and nitrogen in the initial sub-step and then contained only hydrogen in a sub-step of increasing the thickness of the GaN layer up to 3 μm. The above procedure was repeated in such a manner that the nitrogen content was varied from 3% to 70 percent by volume in the initial sub-step, whereby a plurality of epitaxial substrates each including corresponding GaN layers were prepared. In all the epitaxial substrates, the GaN layers had a resistivity of $10^4$ Ω·cm or more.

Comparative Example 1

A plurality of epitaxial substrates each including corresponding GaN layers were prepared according to the same procedure as that described in Example 1 except that only hydrogen was fed through the Group-III source gas supply line 25 and ammonia and hydrogen functioning as a carrier gas therefor were fed through the Group-V source gas supply line 26 in the step of heating the wafer, the heating step being subsequent to the step of forming the GaN buffer layer. The nitrogen content was varied from 0.1% to 70 percent by volume when the epitaxial substrates were prepared. The obtained epitaxial substrates were used as samples for evaluation. All the samples had highly flat mirror surfaces, that is, they had superior surface morphology. The samples were measured for resistivity. Measurement results are shown in FIG. 4 using legend 2. As is clear from FIG. 4, in all the samples, the GaN layers have a resistivity of 1 to 10 Ω·cm.

Comparative Example 2

Ten samples of epitaxial substrates each including corresponding GaN layers were prepared according to the same procedure as that described in Example 1 except that the carrier gas for TMG and the carrier gas for ammonia both contained only hydrogen in the step of forming each GaN layer at 1,180° C. The samples obtained were measured for resistivity. The measurement showed that all the GaN layers had a resistivity of 1 to 10 Ω·cm. All the samples had mirror surfaces, that is, they had superior surface morphology.

Example 3

Ten samples of epitaxial substrates each including corresponding GaN layers were prepared according to the same procedure as that described in Example 1 except that the carrier gas for TMG and the carrier gas for ammonia both contained hydrogen and nitrogen and the nitrogen content was 75 percent by volume in the step of forming the GaN layer at 1,180° C. The samples were measured for resistivity. The measurement showed that all the GaN layers had a resistivity of $10^7$ Ω·cm or more. The samples did not have mirror surfaces, that is, they had inferior surface morphology.

Example 4

Ten samples of epitaxial substrates each including corresponding GaN layers were prepared according to the same procedure as that described in Example 1 except that the lower limit of the nitrogen content of one of the carrier gases was changed from 0.1%, which is the lower limit for a controller, to 2 percent by volume in the initial sub-step of increasing the thickness of the GaN layer up to 50 nm at 1,180° C. The samples were measured for resistivity. The measurement showed that all the GaN layers had a resistivity of 100 Ω·cm. All the samples had mirror surfaces, that is, they had superior surface morphology.

As is clear from comparisons between Examples 1 to 4 and Comparative Examples 1 and 2, according to the present invention, the GaN layers have high resistivity when at least one of the carrier gas for TMG and the carrier gas for ammonia contains nitrogen while the wafer temperature is being increased before the vapor phase reaction is carried out in the step of forming the GaN layer by the vapor phase reaction and when at least one of the carrier gases contains hydrogen and nitrogen in the step of growing the GaN layer by the vapor phase reaction.

In particular, as is clear from a comparison between Example 1 and Comparative Example 2, an advantage due to nitrogen contained in the carrier gases can be obtained even if the nitrogen content is 0.1 percent by volume, which is the lower limit for the controller used in Examples.

As is clear from Example 1, the resistivity of the GaN layer can be adjusted by controlling the nitrogen content of one of the carrier gases containing hydrogen and nitrogen in the step of growing the GaN layer by the vapor phase reaction.

In particular, the resistivity is $10^5$ Ω·cm or more when the nitrogen content is 1 percent by volume or more, and the resistivity is $10^6$ Ω·cm or more when the nitrogen content is 3 percent by volume or more.

As is clear from a comparison between Example 1 and Example 3, in order to allow the GaN layer to have a mirror surface, that is, in order to allow the GaN layer to have superior surface morphology, it is effective that the nitrogen content of one of the carrier gases containing hydrogen and nitrogen be 70 percent by volume or less in the step of growing the GaN layer by the vapor phase reaction.

The present invention is as described above in detail with reference to the embodiments and the examples. The present invention is not limited to the embodiments, and any modifications or variations may be performed within the scope of the present invention. For example, in order to prevent the bowing of epitaxial substrates or in order to enhance the crystallinity of a nitride film, a buffer layer or a multilayer film, such as a strained superlattice, functioning as an intermediate layer may be placed between a wafer and a group of Group-III nitride layers or between GaN layers by varying growing conditions such as the flow rate, the pressure, the feed rate of a source material, and the kind of gas used.

What is claimed is:

1. A method for manufacturing a nitride film including a high-resistivity GaN layer, comprising:

a step of allowing a Group-III source gas containing an organic metal compound that is a gallium source, a Group-V source gas containing ammonia that is a nitrogen source, a carrier gas for the Group-III source gas, and a carrier gas for the Group-V source gas to flow over a predetermined monocrystalline wafer maintained at 1,000° C. or more; and a step of epitaxially growing a nitride film, including a GaN layer, on the monocrystalline wafer by a vapor phase reaction of the source gases, wherein at least one of the carrier gases contains nitrogen while the wafer temperature is being increased before the reaction is carried out, and at least one of the carrier gases contains hydrogen and nitrogen and has a total hydrogen and nitrogen content of 90 percent by volume or more in at least one part of the epitaxially growing step.

2. The method according to claim 1, wherein the epitaxially growing step includes an initial sub-step of starting to form the GaN layer and at least one of the carrier gases has a total hydrogen and nitrogen content of 90 percent by volume or more in the initial sub-step.

3. The method according to claim 1, wherein the epitaxially growing step includes a principal sub-step of growing the GaN layer in earnest, the principal sub-step being subsequent to the initial sub-step, and at least one of the carder gases contains only hydrogen in the principal sub-step.

4. The method according to claim 1, wherein the GaN layer has a thickness of 50 nm or less in the initial sub-step.

5. The method according to claim 1, wherein the resistivity of to GaN layer is adjusted by controlling the nitrogen content of at least one of the carrier gases in the epitaxially growing step, to nitrogen content being defined as the percentage of the nitrogen amount in the total nitrogen and hydrogen amount.

6. The method according to claim 1, wherein the source gases are fed to the monocrystalline wafer, horizontally placed, in to horizontal direction in such a manner that the source gases are separated into upper and lower steams.

7. The method according to claim 6, wherein the Group-V source gas and the carrier gas therefor are fed from a lower portion and to Group-III source gas and the carrier gas therefor are fed from an upper portion.

8. The method according to claim 1, wherein one of the carrier gases which contains substantially only nitrogen and the Group-V source gas containing ammonia are allowed to flow over the monocrystalline wafer while the wafer temperature is being increased before the reaction is carried out.

9. The method according to claim 1, wherein the nitrogen content of one of the carrier gases is 1 percent by volume or more in the epitaxially growing step.

10. The method according to claim 9, wherein the nitrogen content of one of the carrier gases is 3 percent by volume or more in the epitaxially growing step.

11. The method according to claim 9, wherein the nitrogen content of one of to carrier gases is 70 percent by volume or less in to epitaxially growing step.

12. The method according to claim 10, wherein the nitrogen content of one of the carrier gases is 70 percent by volume or less in the epitaxially growing step.

* * * * *

UNITED STATES PATENT AND TRADEMARK OFFICE
CERTIFICATE OF CORRECTION

PATENT NO.         : 7,135,347 B2
APPLICATION NO. : 10/873767
DATED                 : November 14, 2006
INVENTOR(S)       : Makoto Miyoshi et al.

It is certified that error appears in the above-identified patent and that said Letters Patent is hereby corrected as shown below:

<u>Column 11</u>

*Line 34*: please change "carder" to --carrier--

<u>Column 12</u>

*Lines 4, 6, 11, 15, 29 and 30*: please change "to" to --the--
*Line 12*: please change "steams" to --streams--

Signed and Sealed this

Ninth Day of January, 2007

JON W. DUDAS
*Director of the United States Patent and Trademark Office*